United States Patent
Joshi

(10) Patent No.: US 11,309,230 B1
(45) Date of Patent: Apr. 19, 2022

(54) POWER ELECTRONIC MODULES INCLUDING ONE OR MORE LAYERS INCLUDING A POLYMER PRODUCED VIA A FRONTAL RING-OPENING POLYMERIZATION PROCESS

(71) Applicant: Toyota Motor Engineering & Manufacturing North America, Inc., Plano, TX (US)

(72) Inventor: Shailesh N. Joshi, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 5 days.

(21) Appl. No.: 17/036,096

(22) Filed: Sep. 29, 2020

(51) Int. Cl.
H01L 29/76 (2006.01)
H01L 23/14 (2006.01)
(Continued)

(52) U.S. Cl.
CPC ...... H01L 23/3737 (2013.01); H01L 21/4871 (2013.01); H01L 24/29 (2013.01); H01L 24/48 (2013.01); H01L 24/83 (2013.01)

(58) Field of Classification Search
CPC . H01L 21/4871; H01L 23/3737; H01L 24/48; H01L 24/83; H01L 24/29
See application file for complete search history.

(56) References Cited

U.S. PATENT DOCUMENTS

| 9,929,345 B1 | 3/2018 | Lu et al. |
| 10,487,446 B2 | 11/2019 | Robertson et al. |

(Continued)

FOREIGN PATENT DOCUMENTS

| KR | 1159304 B1 | 6/2012 |
| KR | 1463215 B1 | 12/2014 |
| KR | 1974543 B1 | 5/2019 |

OTHER PUBLICATIONS

Ian D. Robertson, et al., "Frontal Ring-Opening Metathesis Polymerization of Exo-Dicyclopentadiene for Low Catalyst Loadings," ACS Macro Letters 2016 5 (5), pp. 593-596, Apr. 25, 2016. URL: https://pubs.acs.org/doi/1 0.1021 /acsmacrolett.6b00227.
(Continued)

*Primary Examiner* — Alonzo Chambliss
(74) *Attorney, Agent, or Firm* — Dinsmore & Shohl, LLP

(57) ABSTRACT

In one or more embodiments of the present disclosure, a power electronic module may be described. The power electronic module may comprise a power semiconductor device, a substrate coupled to the power semiconductor device, and a base plate coupled to the substrate. The substrate may include from 50 weight percent (wt. %) to 99.9 wt. % of a poly(dicyclopentadiene) polymer. In one or more other embodiments of the present disclosure, a method for manufacturing a power electronic module may be described. The method may include disposing a solution on a base plate. The solution may include dicyclopentadiene monomer, a ruthenium-based catalyst, and a trialkyl phosphite initiator. The method may further include initiating a polymerization front within the solution to produce a substrate formed directly on the base plate. Furthermore, the method may include coupling a power semiconductor device on the substrate to produce the power electronic module.

20 Claims, 2 Drawing Sheets

(51) Int. Cl.
*H01L 23/34* (2006.01)
*H01L 21/00* (2006.01)
*H01L 23/373* (2006.01)
*H01L 21/48* (2006.01)
*H01L 23/00* (2006.01)

(56) References Cited

U.S. PATENT DOCUMENTS

| 10,529,494 B2 | 1/2020 | Miyazawa et al. | |
|---|---|---|---|
| 2009/0175000 A1* | 7/2009 | Japp | H01L 23/145 |
| | | | 361/679.55 |
| 2016/0060429 A1* | 3/2016 | Kitai | C08K 3/36 |
| | | | 174/258 |
| 2016/0086893 A1* | 3/2016 | Wu | H01L 23/145 |
| | | | 257/669 |

OTHER PUBLICATIONS

Diana Gottschalk, "Use Of Polydicyclopentadiene as a Matrix In Composite Structural Capacitors," Iowa State University Capstones, Graduate Theses and Dissertations, Jan. 2011. URL: https://www.researchgate.net/publication/254610520_Use_of_polydicyclopentadiene_as_a_matrix_in_composite_structural_capacitors.

\* cited by examiner

US 11,309,230 B1

POWER ELECTRONIC MODULES INCLUDING ONE OR MORE LAYERS INCLUDING A POLYMER PRODUCED VIA A FRONTAL RING-OPENING POLYMERIZATION PROCESS

TECHNICAL FIELD

The present specification generally relates to improved power electronics modules, and more specifically to power electronic modules that include a substrate that include a polymer produced via a frontal ring-opening polymerization (FROMP) method.

BACKGROUND

Currently, a heat generating device, such as a power semiconductor device, is coupled to a substrate, such as a direct bonded copper (DBC) substrate, which are in turn coupled to a base plate to remove heat and reduce the maximum operating temperature of the heat generating device. Generally, each of these components are coupled together using a bonding layer of, such as a solder layer. As a result, a minimum of five to seven layers are typically used for the effective operation of the heat generating device, which limits the minimum achievable size of the heat generating device assembly. Moreover, these layers do not create an effective thermal path. That is, due to the numerous layers, a significant thermal resistance exists between the heat generating device and the base plate, which limits the amount by which the maximum operating temperature of the heat generating device may be reduced.

SUMMARY

Accordingly, there is an ongoing need for power electronic modules that reduce the number of layers required for efficient coupling of the components and removal of heat from the power semiconductor devices of the power electronic modules. This may be accomplished by the embodiments of the present disclosure. In particular, the embodiments of the present disclosure use a polymer formed from a frontal ring-opening polymerization (FROMP) method. This polymer may have the properties and characteristics, such as being an electric insulator while also having high thermal conductivity. Moreover, the frontal ring-opening polymerization (FROMP) method used to produce the polymer may allow for the elimination of one or more layers from the power electronic module. In particular, the frontal ring-opening polymerization (FROMP) method allows for the substrate to be formed directly on the surface of the base plate of the power electronic module, eliminating the need for at least one layer of solder that is used to couple conventional substrates to base plates. As a result, the embodiments of the present disclosure may allow for the reduction of the thermal resistance between the power semiconductor device and the base plate, as well as a reducing in the overall size of the power electronic module, by eliminating these one or more layers.

In one or more embodiments of the present disclosure, a power electronic module includes a power semiconductor device, a substrate coupled to the power semiconductor device, and a base plate coupled to the substrate. The substrate may include from 50 weight percent (wt. %) to 99.9 wt. % of a poly(dicyclopentadiene) polymer.

In one or more other embodiments of the present disclosure, a method for manufacturing a power electronic module includes disposing a solution on a base plate. The solution may include dicyclopentadiene monomer, a ruthenium-based catalyst, and a trialkyl phosphite initiator. The method may further include initiating a polymerization front within the solution to produce a substrate formed directly on the base plate. Furthermore, the method may include coupling a power semiconductor device on the substrate to produce the power electronic module.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

As noted hereinabove, embodiments of the present disclosure are directed to power electronic modules that include one or more layers including a polymer produced via a frontal ring-opening polymerization (FROMP) method. As noted hereinabove, in conventional power electronic modules, power semiconductor device are typically coupled to a substrate, such as a direct bonded copper (DBC) substrate, which are in turn coupled to a base plate to remove heat and reduce the maximum operating temperature of the heat generating device. Generally, each of these components are coupled together using a bonding layer, such as a solder layer. As a result, a minimum of five to seven layers are typically used for the effective operation of the heat generating device, which limits the minimum achievable size of the heat generating device. Moreover, these layers do not create an effective thermal path. That is, due to the numerous layers, a significant thermal resistance exists between the heat generating device and the base plate, which limits the amount by which the maximum operating temperature of the heat generating device may be reduced.

In contrast, the embodiments eliminate one or more of these layers, which limit the operating conditions of the power electronic module. In particular, the embodiments of the present disclosure use a polymer formed from a frontal ring-opening polymerization (FROMP) method. This polymer may have suitable properties and characteristics, such as dielectric strength, coefficient of thermal expansion, and Young's modulus, such that the polymer is an electric insulator while also having high thermal conductivity. Moreover, the frontal ring-opening polymerization (FROMP) method used to produce the polymer may allow for the elimination of one or more layers from the power electronic module. In particular, the frontal ring-opening polymerization (FROMP) method allows for the substrate to be formed directly on the surface of the base plate of the power electronic module, eliminating the need for at least one layer of solder that is used to couple conventional substrates to base plates. As a result, the embodiments of the present disclosure may allow for the reduction of the thermal resistance between the power semiconductor device and the base plate, as well as a reducing in the overall size of the power electronic module, by eliminating these one or more layers.

Figure 1:
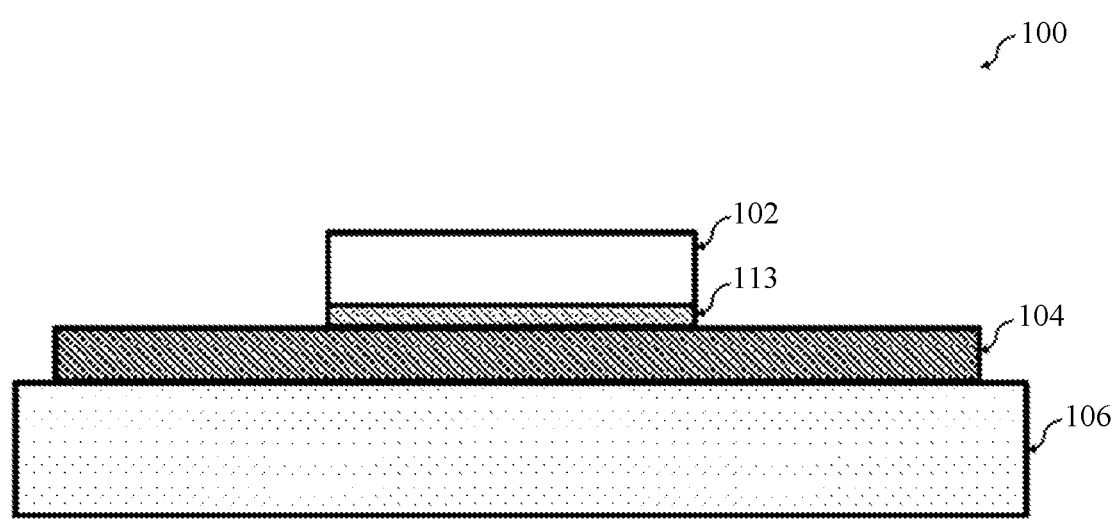
FIG. 1 schematically depicts a cross-sectional view of an example power electronic module including a power semiconductor device coupled to a substrate that is coupled to a base plate, according to embodiments of the present disclosure.

Referring now to FIG. 1, a power electronics module 100 comprising a power semiconductor device 102 coupled to a substrate 104 that is coupled to a base plate 106 is schematically depicted. In embodiments, the power semiconductor device 102 may include one or more power semiconductor devices, such as, but not limited to, an insulated gate bipolar transistor (IGBT), a reverse conducting insulated gate bipolar transistor (RC-IGBT), a metal-oxide-semiconductor field-effect transistor (MOSFET), a power metal-oxide-semiconductor field-effect transistor (MOSFET), a diode, a power diode, a transistor, a power bipolar transistor, and/or combinations thereof. In embodiments, the power semiconductor device 102 may be formed from any suitable material such as, but not limited to, silicon carbide (SiC), silicon dioxide ($SiO_2$), aluminum nitride (AlN), gallium nitride (GaN), boron nitride (BN), and combinations thereof.

As an example and not a limitation, the power semiconductor device 102 may be included in the power electronic module 100 as a component in an inverter and/or converter circuit used to electrically power high load devices, such as electric motors in electrified vehicles, such as, for example, hybrid vehicles, plug-in hybrid electric vehicles, plug-in electric vehicles, and the like. In such embodiments, the power semiconductor device 102 may operate at high current and/or high power, such as, for example, power greater than or equal to 40 kilowatts (kW), greater than or equal to 50 kW, greater than or equal to 60 kW, greater than or equal to 70 kW, greater than or equal to 80 kW, greater than or equal to 90 kW, greater than or equal to 100 kW, greater than or equal to 110 kW, greater than or equal to 120 kW, greater than or equal to 130 kW, greater than or equal to 140 kW, or greater than or equal to 150 kW. Moreover, the power semiconductor device 102 may operate under high temperatures, such as, for example, temperatures greater than or equal to 100 degrees Celsius (° C.), greater than or equal to 125° C., greater than or equal to 150° C., greater than or equal to 175° C., greater than or equal to 200° C., greater than or equal to 225° C., or greater than or equal to 250° C. This may result in the power semiconductor device 102 generating significant amounts of heat. If this heat is not removed from the power semiconductor device 102, the power semiconductor device 102 may not be capable of continued operation without failure.

Figure 2:
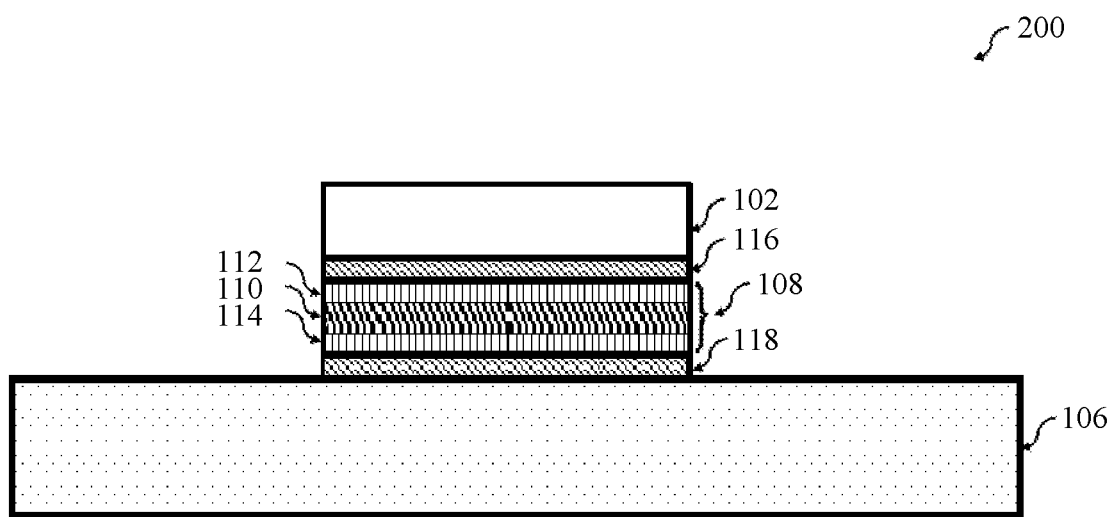
FIG. 2 schematically depicts a cross-sectional view of an example power electronic module including a power semiconductor device coupled to a substrate that is coupled to a base plate, according to conventional embodiments.

As noted hereinabove, the heat may be removed from the power semiconductor device 102 by coupling the power semiconductor device 102 to a substrate, such as the substrate 104, that is coupled to a base plate, such as the base plate 106. Referring now to FIG. 2, a conventional power electronics module 200 comprising a power semiconductor device 102 coupled to a substrate 108 that is coupled to a base plate 106 is schematically depicted. Conventional substrates, such as the substrate 108, typically include an insulating dielectric layer 110 disposed between two metal layers 112, 114. The insulating dielectric layer 110 may be formed from alumina, aluminum nitride, silicon nitride, silicon carbide, beryllium oxide, and/or combinations thereof, and the two metal layers 112, 114 may be formed from copper, aluminum, gold, silver, and/or combinations thereof. For example, the substrate 108 may be a direct bonded copper (DBC) substrate or a direct bonded aluminum (DBA) substrate.

As depicted in FIG. 2, a first layer of solder 116 may be used to couple the power semiconductor device 102 to the substrate 108 and a second layer of solder 118 may be used to couple the substrate 108 to the base plate 106. As noted hereinabove, the use of a conventional substrate may necessarily limit the minimum size of the power electronic module 200 due, at least in part, to the number of layers of the substrate 108 as well as the additional layers of the solder 116, 118 used to couple the power semiconductor device 102, the substrate 108, and the base plate 106. Moreover, the use of a conventional substrate may necessarily limit the amount by which the maximum operating temperature of the power semiconductor device 102 may be reduced due, at least in part, to the significant thermal resistance created by the number of layers of the substrate 108 as well as the additional layers of the solder 116, 118 used to couple the power semiconductor device 102, the substrate 108, and the base plate 106.

Referring again to FIG. 1, the power electronics module 100 may include a power semiconductor device 102 coupled to a substrate 104. In embodiments, the substrate 104 may include a poly(dicyclopentadiene) (PDCPD) polymer. As used herein, the term "polymer" may refer to polymeric compounds prepared by polymerizing monomers, whether of the same or a different type. In some embodiments, the poly(dicyclopentadiene) polymer may be a homopolymer. As used herein, the term "homopolymer" may refer to a polymer that is prepared by polymerizing only one monomer. In other embodiments, the poly(dicyclopentadiene) polymer may be a interpolymer. As used herein, the term "interpolymer" may refer to a polymer that is prepared by polymerizing at least two monomers. For example, the poly(dicyclopentadiene) polymer may be a polymeric compound prepared by polymerizing dicyclopentadiene (DCPC) monomer or the poly(dicyclopentadiene) polymer may be a polymeric compound prepared by polymerizing dicyclopentadiene monomer at least one additional comonomer.

The poly(dicyclopentadiene) polymer may have the dielectric, thermal, and/or mechanical properties, such as dielectric strength, coefficient of thermal expansion (CTE), and/or Young's modulus, necessary to function as the substrate 104. That is, the poly(dicyclopentadiene) polymer may be electrically insulating while also being thermally conductive and providing the necessary strength to support the power semiconductor device 102.

For example, in embodiments, the poly(dicyclopentadiene) polymer may have a dielectric strength suitable for use as the substrate 130 in the power electronic module 100. In embodiments, the poly(dicyclopentadiene) polymer may have a dielectric strength of from 5.0 kilovolts per micron (kV/μm) to 15 kV/μm, such as from 5.0 kV/μm to 13 kV/μm, from 5.0 kV/μm to 11 kV/μm, from 5.0 kV/μm to 9.0 kV/μm, from 5.0 kV/μm to 7.0 kV/μm, from 7.0 kV/μm to 15 kV/μm, from 7.0 kV/μm to 13 kV/μm, from 7.0 kV/μm to 11 kV/μm, from 7.0 kV/μm to 9.0 kV/μm, from 9.0 kV/μm to 15 kV/μm, from 9.0 kV/μm to 13 kV/μm, from 9.0 kV/μm to 11 kV/μm, from 11 kV/μm to 15 kV/μm, from 11 kV/μm to 13 kV/μm, or from 13 kV/μm to 15 kV/μm.

In embodiments, the poly(dicyclopentadiene) polymer may have a Young's modulus suitable for use as the substrate 130 in the power electronic module 100. For example, the poly(dicyclopentadiene) polymer may have a Young's modulus of from 5.0 gigapascals (GPa) to 15 GPa, such as from 5.0 GPa to 13 GPa, from 5.0 GPa to 11 GPa, from 5.0 GPa to 9.0 GPa, from 5.0 GPa to 7.0 GPa, from 7.0 GPa to 15 GPa, from 7.0 GPa to 13 GPa, from 7.0 GPa to 11 GPa, from 7.0 GPa to 9.0 GPa, from 9.0 GPa to 15 GPa, from 9.0 GPa to 13 GPa, from 9.0 GPa to 11 GPa, from 11 GPa to 15 GPa, from 11 GPa to 13 GPa, or from 13 GPa to 15 GPa.

In embodiments, the poly(dicyclopentadiene) polymer may have a coefficient of thermal expansion (CTE) suitable for use as the substrate 130 in the power electronic module 100. For example, the poly(dicyclopentadiene) polymer may have a coefficient of thermal expansion (CTE) of from 5.0 part per million per degrees Celsius (ppm/° C.) to 10 ppm/° C., such as from 5.0 ppm/° C. to 9.0 ppm/° C., from 5.0 ppm/° C. to 8.0 ppm/° C., from 5.0 ppm/° C. to 7.0 ppm/° C., from 5.0 ppm/° C. to 6.0 ppm/° C., from 6.0 ppm/° C. to 10 ppm/° C., from 6.0 ppm/° C. to 9.0 ppm/° C., from 6.0 ppm/° C. to 8.0 ppm/° C., from 6.0 ppm/° C. to 7.0 ppm/° C., from 7.0 ppm/° C. to 10 ppm/° C., from 7.0 ppm/° C. to 9.0 ppm/° C., from 7.0 ppm/° C. to 8.0 ppm/° C., from 8.0 ppm/° C. to 10 ppm/° C., from 8.0 ppm/° C. to 9.0 ppm/° C., or from 9.0 ppm/° C. to 10 ppm/° C.

As noted hereinabove, the poly(dicyclopentadiene) polymer may be prepared by the polymerization of dicyclopentadiene monomer and, optionally, one or more additional monomers. In particular, the poly(dicyclopentadiene) polymer may be prepared by the frontal ring-opening metathesis polymerization (FROMP) of dicyclopentadiene monomer and, optionally, one or more additional monomers. Frontal ring-opening metathesis polymerization is characterized in that the polymerization front self-propagates through the monomer in a uniform direction, such as from the top of the vessel the monomer is placed in to the bottom of the vessel. Moreover, frontal ring-opening metathesis polymerization is characterized in that the polymerization process has a relatively mild operating conditions, such as low initiation temperatures and pressures.

The poly(dicyclopentadiene) polymer may be prepared by any known frontal ring-opening metathesis polymerization method known in the art. For example, in embodiments, a solution including the dicyclopentadiene monomer, a catalyst, and an initiator may be prepared. The solution may be poured or deposited wherever the substrate 104 is desired, such as on the base plate 106, and a polymerization front may be initiated to form the poly(dicyclopentadiene) polymer. In embodiments, the poly(dicyclopentadiene) polymer may be prepared by a thermal frontal polymerization (TFP) method, which uses an external energy source to initiate the polymerization front, a photofrontal polymerization method, which uses an external ultraviolet (UV) source to initiate the polymerization front, or an isothermal frontal polymerization (IFP) method, which uses the Norrish-Trommsdorff, or gel effect, that occurs when monomer and initiator diffuse into a polymer seed to initiate the polymerization front.

The catalyst used to initiate the polymerization front may be any suitable catalyst known in the art. For example, in embodiments, the catalyst may be a ruthenium-based catalyst, such as a ruthenium-benzylidene or ruthenium-indenylidine Grubbs-type complex. The initiator may be any suitable initiator known in the art that is compatible with the selected catalyst. For example, in embodiments wherein the catalyst is a ruthenium-benzylidene or ruthenium-indenylidine Grubbs-type complex, the initiator may be a trialkyl phosphite (P(OR)$_3$). An example frontal ring-opening metathesis polymerization of a dicyclopentadiene using a ruthenium-based catalyst and a trialkyl phosphite initiator is provided by Formula I:

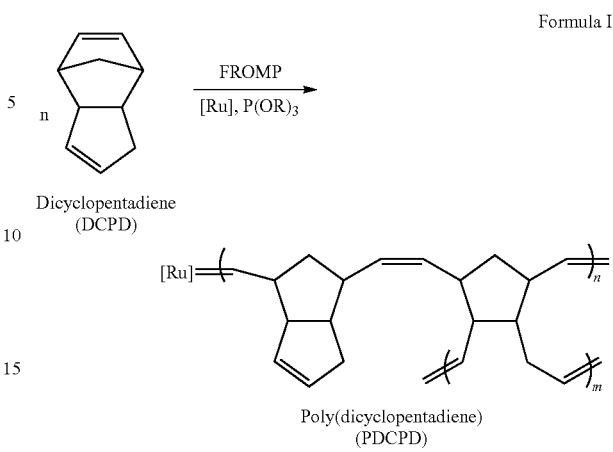

Formula I

Dicyclopentadiene (DCPD)

Poly(dicyclopentadiene) (PDCPD)

In embodiments, the poly(dicyclopentadiene) polymer may include one or more fillers and/or additives. The additives may be added to the poly(dicyclopentadiene) polymer in order to alter one or more properties of the poly(dicyclopentadiene) polymer and, as a result, the substrate 104. The one or more fillers and/or additives may be incorporated into the poly(dicyclopentadiene) polymer by mixing the additives directly with the monomer solution prior to the initiation of the polymerization front. For example, in embodiments, one or more ceramic particles, such as silicon carbide (SiC), boron nitride (BN), silicon nitride (Si$_3$N$_4$), or combinations of these, may be included in the poly(dicyclopentadiene) polymer. The ceramic particles, which are typically electrically insulating and/or thermally conductive, may improve the dielectric strength and/or the thermal conductivity of the poly(dicyclopentadiene) polymer and, as a result, the substrate 104. While the material of the additives is not particularly limited, it should be understood that materials that are conductive and/or generally reduce the dielectric strength of the poly(dicyclopentadiene) polymer should not be included as these conductive materials may result in the short and failure of the power semiconductor device 102. In embodiments, the fillers and/or additive may also be added to the poly(dicyclopentadiene) polymer in order to alter one or more mechanical properties of the poly(dicyclopentadiene) polymer and, as a result, the substrate 104. For example, the addition of the additives to the poly(dicyclopentadiene) polymer may improve the Young's modulus of the poly(dicyclopentadiene) polymer, the coefficient of thermal expansion (CTE) of the poly(dicyclopentadiene) polymer, or combinations thereof.

In embodiments, the substrate 104 may include a poly(dicyclopentadiene) polymer in an amount greater than or equal to 50.0 weight percent (wt. %) based on the total weight of the substrate 104. For example, the substrate 104 may include a poly(dicyclopentadiene) polymer in an amount of from 50.0 wt. % to 99.9 wt. %, from 50.0 wt. % to 99.5 wt. %, from 50.0 wt. % to 99.0 wt. %, from 50.0 wt. % to 95.0 wt. %, from 50.0 wt. % to 90.0 wt. %, from 50.0 wt. % to 80.0 wt. %, from 50.0 wt. % to 70.0 wt. %, from 50.0 wt. % to 60.0 wt. %, from 60.0 wt. % to 99.9 wt. %, from 60.0 wt. % to 99.5 wt. %, from 60.0 wt. % to 99.0 wt. %, from 60.0 wt. % to 95.0 wt. %, from 60.0 wt. % to 90.0 wt. %, from 60.0 wt. % to 80.0 wt. %, from 60.0 wt. % to 70.0 wt. %, from 70.0 wt. % to 99.9 wt. %, from 70.0 wt. % to 99.5 wt. %, from 70.0 wt. % to 99.0 wt. %, from 70.0 wt.

% to 95.0 wt. %, from 70.0 wt. % to 90.0 wt. %, from 70.0 wt. % to 80.0 wt. %, from 80.0 wt. % to 99.9 wt. %, from 80.0 wt. % to 99.5 wt. %, from 80.0 wt. % to 99.0 wt. %, from 80.0 wt. % to 95.0 wt. %, from 80.0 wt. % to 90.0 wt. %, from 90.0 wt. % to 99.9 wt. %, from 90.0 wt. % to 99.5 wt. %, from 90.0 wt. % to 99.0 wt. %, from 90.0 wt. % to 95.0 wt. %, from 95.0 wt. % to 99.9 wt. %, from 95.0 wt. % to 99.5 wt. %, from 95.0 wt. % to 99.0 wt. %, from 99.0 wt. % to 99.9 wt. %, from 99.0 wt. % to 99.5 wt. %, or from 99.5 wt. % to 99.9 wt. % based on the total weight of the substrate 104.

In embodiments, the substrate 104 may include the one or more fillers and/or additives in an amount less than or equal to 10 weight percent (wt. %) based on the total weight of the substrate 104. For example, the substrate 104 may include the one or more fillers and/or additives in an amount of from 0.0 wt. % to 10 wt. %, from 0.0 wt. % to 5.0 wt. %, from 0.0 wt. % to 4.0 wt. %, from 0.0 wt. % to 3.0 wt. %, from 0.0 wt. % to 2.0 wt. %, from 0.0 wt. % to 1.0 wt. %, from 0.0 wt. % to 0.5 wt. %, from 0.0 wt. % to 0.1 wt. %, from 0.1 wt. % to 10 wt. %, from 0.1 wt. % to 5.0 wt. %, from 0.1 wt. % to 4.0 wt. %, from 0.1 wt. % to 3.0 wt. %, from 0.1 wt. % to 2.0 wt. %, from 0.1 wt. % to 1.0 wt. %, from 0.1 wt. % to 0.5 wt. %, from 0.5 wt. % to 10 wt. %, from 0.5 wt. % to 5.0 wt. %, from 0.5 wt. % to 4.0 wt. %, from 0.5 wt. % to 3.0 wt. %, from 0.5 wt. % to 2.0 wt. %, from 0.5 wt. % to 1.0 wt. %, from 1.0 wt. % to 10 wt. %, from 1.0 wt. % to 5.0 wt. %, from 1.0 wt. % to 4.0 wt. %, from 1.0 wt. % to 3.0 wt. %, from 1.0 wt. % to 2.0 wt. %, from 2.0 wt. % to 10 wt. %, from 2.0 wt. % to 5.0 wt. %, from 2.0 wt. % to 4.0 wt. %, from 2.0 wt. % to 3.0 wt. %, from 3.0 wt. % to 10 wt. %, from 3.0 wt. % to 5.0 wt. %, from 3.0 wt. % to 4.0 wt. %, from 4.0 wt. % to 10 wt. %, from 4.0 wt. % to 5.0 wt. %, or from 5.0 wt. % to 10 wt. % based on the total weight of the substrate 104.

Referring again to FIG. 1, the power semiconductor device 102 may be coupled to the substrate 104. In embodiments, the power semiconductor device 102 may be coupled to the substrate 104 via a layer of solder 116. In such embodiments, an electrically conductive coupling layer (not shown) may be disposed across the surface of the substrate 104 prior to coupling the power semiconductor device 102 to the substrate 104. The coupling layer may be deposited by any method known in the art, such as by electroplating, sputtering, or combinations of these. In other embodiments, the power semiconductor device may be embedded directly into the substrate 104. This may be accomplished by submerging the power semiconductor device 102 in the monomer solution prior to the initiation of the polymerization front.

The substrate 104 may be coupled (e.g., bonded) to the base plate 106. The base plate 106 may be a cooling apparatus, such as a heat sink or cold plate, that is operable to remove heat from the power semiconductor device 102 and the substrate 104. As noted hereinabove, the substrate 104 may include a poly(dicyclopentadiene) polymer that is prepared via a frontal ring-opening polymerization method. As noted hereinabove, such methods result in a uniform polymerization front that may be imitated at relatively low temperatures and pressures. As such, in embodiments, the substrate 104 may be coupled to the base plate 106 by forming the poly(dicyclopentadiene) polymer of the substrate 104 directly on the base plate 106. In such embodiments, for example, a solution that includes the monomer, the catalyst, and the initiator, as described in detail hereinabove, may be poured or otherwise deposited directly onto the base plate 106. Once the solution has been deposited on the base plate 106, the substrate 104 may be formed by initiating a polymerization front within the solution as discussed in detail hereinabove.

Referring again to FIG. 2, as discussed hereinabove, conventional substrates, such as the substrate 108, are bonded to the base plate 106 via a solder layer. The frontal ring-opening polymerization of the present disclosure may allow for such solder layers to be eliminated as the substrate 104 may be formed directly upon the base plate 106. This may improve the thermal conductivity of the power electronic module 100 compared to conventional power electronic modules, such as the power electronic module depicted in FIG. 2. Moreover, the elimination of solder layer 118 may reduce the minimum achievable size of the power electronic module 100 compared to conventional power electronic modules, such as the power electronic module depicted in FIG. 2.

While the embodiments of the present disclosure, such as the embodiment depicted in FIG. 1, is described as a power electronic module including a single power semiconductor device coupled to a single substrate, it should be understood that, in embodiments, the power electronic module 100 may include two or more power semiconductor devices coupled to one or more discrete substrates.

Moreover, it should be understood that the poly(dicyclopentadiene) polymer may have one or more applications in electronic devices similar to the power electronic module 100 of the present disclosure. For example, in alternative embodiments, the poly(dicyclopentadiene) polymer may be used as an encapsulating layer to cover one or more power electronic modules. That is, the power electronic module 100, or even the power electronic module 200, may be encapsulated by the poly(dicyclopentadiene) polymer. This may prevent and protect the power electronic modules from abrasion or short caused by contact with an external element. Conventional encapsulation methods require high temperature and/or high pressure polymerization methods to achieve such an encapsulation. However, as discussed in detail hereinabove, the poly(dicyclopentadiene) polymer of the present disclosure may allow the power electronic modules to be encapsulated by a frontal ring-opening polymerization method that uses low temperatures and low pressures.

It should now be understood that embodiments described herein are directed to various configurations of a power electronic module having an improved thermal conductivity and reduced size. The power electronic module may generally include a power semiconductor device coupled to a substrate coupled to a base plate. The substrate may include a poly(dicyclopentadiene) polymer produced via the frontal ring-opening polymerization of dicyclopentadiene monomer. The frontal ring-opening polymerization method used to produce the poly(dicyclopentadiene) polymer may allow for the substrate to be formed directly on the base plate, which effectively eliminates a layer that was formally necessary in conventional power electronic modules. The removal of this layer, which limited the thermal conductivity and size of conventional power electronic modules, may in turn improve the thermal conductivity of the power electronic module, improving the operational temperatures of the power semiconductor device, and reduce the minimum achievable size of the power electronic module.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronic module comprising:
   a power semiconductor device;
   a substrate coupled to the power semiconductor device, wherein the substrate comprises from 50 weight percent (wt. %) to 99.9 wt. % of a poly(dicyclopentadiene) polymer; and
   a base plate coupled to the substrate.

2. The power electronic module of claim 1, wherein the power semiconductor device comprises an insulated gate bipolar transistor (IGBT), a reverse conducting insulated gate bipolar transistor (RC-IGBT), a metal-oxide-semiconductor field-effect transistor (MOSFET), a power metal-oxide-semiconductor field-effect transistor (MOSFET), a diode, a power diode, a transistor, a power bipolar transistor, or combinations thereof.

3. The power electronic module of claim 1, wherein the power semiconductor device comprises silicon carbide (SiC), silicon dioxide ($SiO_2$), aluminum nitride (AlN), gallium nitride (GaN), boron nitride (BN), or combinations thereof.

4. The power electronic module of claim 1, wherein the poly(dicyclopentadiene) polymer is a homopolymer.

5. The power electronic module of claim 1, wherein the poly(dicyclopentadiene) polymer is an interpolymer.

6. The power electronic module of claim 1, wherein the poly(dicyclopentadiene) polymer has a dielectric strength of from 5.0 kilovolts per micron (kV/μm) to 15 kV/μm.

7. The power electronic module of claim 1, wherein the poly(dicyclopentadiene) polymer has a Young's modulus of from 5.0 gigapascals (GPa) to 15 GPa.

8. The power electronic module of claim 1, wherein the poly(dicyclopentadiene) polymer has a coefficient of thermal expansion (CTE) of from 5.0 part per million per degrees Celsius (ppm/° C.) to 10 ppm/° C.

9. The power electronic module of claim 1, wherein the substrate is formed directly on the base plate.

10. The power electronic module of claim 1, wherein the substrate further comprises one or more additives or fillers in an amount of from 0.1 wt. % to 10 wt. %.

11. A method for manufacturing a power electronic module, the method comprising:
    disposing a solution on a base plate, the solution comprising dicyclopentadiene monomer, a ruthenium-based catalyst, and a trialkyl phosphite initiator;
    initiating a polymerization front within the solution to produce a substrate formed directly on the base plate; and
    coupling a power semiconductor device on the substrate to produce the power electronic module.

12. The method of claim 11, wherein the polymerization front is initiated by a thermal frontal polymerization (TFP) method, a photofrontal polymerization method, or an isothermal frontal polymerization (IFP) method.

13. The method of claim 11, further comprising electroplating a coupling layer onto the surface of the substrate.

14. The method of claim 13, wherein the power semiconductor device is coupled to the coupling layer via a layer of solder.

15. The method of claim 11, wherein the substrate comprises from 50 wt. % to 99.9 wt. % of a poly(dicyclopentadiene) polymer.

16. The method of claim 11, wherein the power semiconductor device comprises an insulated gate bipolar transistor (IGBT), a reverse conducting insulated gate bipolar transistor (RC-IGBT), a metal-oxide-semiconductor field-effect transistor (MOSFET), a power metal-oxide-semiconductor field-effect transistor (MOSFET), a diode, a power diode, a transistor, a power bipolar transistor, or combinations thereof.

17. The method of claim 11, wherein the power semiconductor device comprises silicon carbide (SiC), silicon dioxide ($SiO_2$), aluminum nitride (AlN), gallium nitride (GaN), boron nitride (BN), or combinations thereof.

18. The method of claim 11, wherein the poly(dicyclopentadiene) polymer has a dielectric strength of from 5.0 kilovolts per micron (kV/μm) to 15 kV/μm.

19. The method of claim 11, wherein the poly(dicyclopentadiene) polymer has a Young's modulus of from 5.0 gigapascals (GPa) to 15 GPa.

20. The method of claim 11, wherein the poly(dicyclopentadiene) polymer has a coefficient of thermal expansion (CTE) of from 5.0 part per million per degrees Celsius (ppm/° C.) to 10 ppm/° C.

* * * * *

UNITED STATES PATENT AND TRADEMARK OFFICE
CERTIFICATE OF CORRECTION

PATENT NO. : 11,309,230 B1
APPLICATION NO. : 17/036096
DATED : April 19, 2022
INVENTOR(S) : Shailesh N. Joshi It is certified that error appears in the above-identified patent and that said Letters Patent is hereby corrected as shown below:

On the Title Page

Item (74), attorney, agent, or firm, delete "Dinsmore & Shohl, LLP" and insert --Dinsmore & Shohl LLP--, therefor.

In the Specification

In Column 1, Line(s) 39 & 40, after "devices", delete "of the power electronic modules".

In Column 5, Line(s) 35, after "process has", delete "a".

Signed and Sealed this
Second Day of August, 2022

Katherine Kelly Vidal
*Director of the United States Patent and Trademark Office*